(12) United States Patent
Viereck et al.

(10) Patent No.: US 11,054,486 B2
(45) Date of Patent: Jul. 6, 2021

(54) METHOD AND DEVICE FOR MONITORING CAPACITOR BUSHINGS FOR AN ALTERNATING-CURRENT GRID

(71) Applicant: MASCHINENFABRIK REINHAUSEN GMBH, Regensburg (DE)

(72) Inventors: Karsten Viereck, Regensburg (DE); Junliang Wu, Regensburg (DE); Udo Hertel, Regensburg (DE)

(73) Assignee: MASCHINENFABRIK REINHAUSEN GMBH, Regensburg (DE)

( * ) Notice: Subject to any disclaimer, the term of this patent is extended or adjusted under 35 U.S.C. 154(b) by 158 days.

(21) Appl. No.: 16/488,617

(22) PCT Filed: Feb. 22, 2018

(86) PCT No.: PCT/EP2018/054412
§ 371 (c)(1),
(2) Date: Aug. 26, 2019

(87) PCT Pub. No.: WO2018/158138
PCT Pub. Date: Sep. 7, 2018

(65) Prior Publication Data
US 2021/0141031 A1   May 13, 2021

(30) Foreign Application Priority Data

Feb. 28, 2017   (DE) .................... 10 2017 104 109.5

(51) Int. Cl.
*G01R 31/64* (2020.01)
*G01R 15/06* (2006.01)
*G01R 27/26* (2006.01)

(52) U.S. Cl.
CPC ............. *G01R 31/64* (2020.01); *G01R 15/06* (2013.01); *G01R 27/2605* (2013.01)

(58) Field of Classification Search
CPC ..... G01R 31/64; G01R 27/2605; G01R 15/06
(Continued)

(56) References Cited

U.S. PATENT DOCUMENTS

| 4,757,263 A | 7/1988 | Cummings, III et al. |
| 6,028,430 A | 2/2000 | Frielingsdorf |

(Continued)

FOREIGN PATENT DOCUMENTS

| DE | 3601934 C2 | 2/1995 |
| DE | 19519230 C1 | 11/1996 |

(Continued)

OTHER PUBLICATIONS

Rene Seeberger: "Capacitance and Dissipation Factor Measurements", IEEE Electrical Insulation Magazine, vol. 2, No. 1, Jan. 1, 1986 (Jan. 1, 1986), pp. 27-36, XP011360491.

*Primary Examiner* — Farhana A Hoque
(74) *Attorney, Agent, or Firm* — Leydig, Voit & Mayer, Ltd.

(57) ABSTRACT

A method monitors capacitor bushings of a three-phase AC mains, which has first, second, and third mains lines respectively associated with first, second, and third: phases, capacitor bushings, and mains voltages. Each of the capacitor bushings has: a conductor connected with the associated mains line, and an electrically conductive foil enclosing the conductor. The method includes, for each of the phases: determining, at a predetermined initial instant for a characteristic variable, which is characteristic for the respective capacitor bushing, a corresponding characteristic value; determining, at a predetermined later instant after the initial instant for the characteristic variable, a corresponding nor- (Continued)

malised characteristic value in dependence on the respective characteristic value and/or on at least one of remaining characteristic values; and checking whether the normalised characteristic value has impermissibly changed.

27 Claims, 5 Drawing Sheets

(58) Field of Classification Search
USPC .................................................. 324/548, 713
See application file for complete search history.

(56) References Cited

U.S. PATENT DOCUMENTS

2003/0184325 A1\* 10/2003 Koch ................. G01R 27/2605
324/713
2016/0252564 A1 9/2016 Wu et al.

FOREIGN PATENT DOCUMENTS

| DE | 10037432 A1 | 2/2002 |
|----|----|----|
| EP | 0747715 A2 | 12/1996 |
| WO | WO 0169272 A2 | 9/2001 |
| WO | WO 2015071253 A1 | 5/2015 |

\* cited by examiner

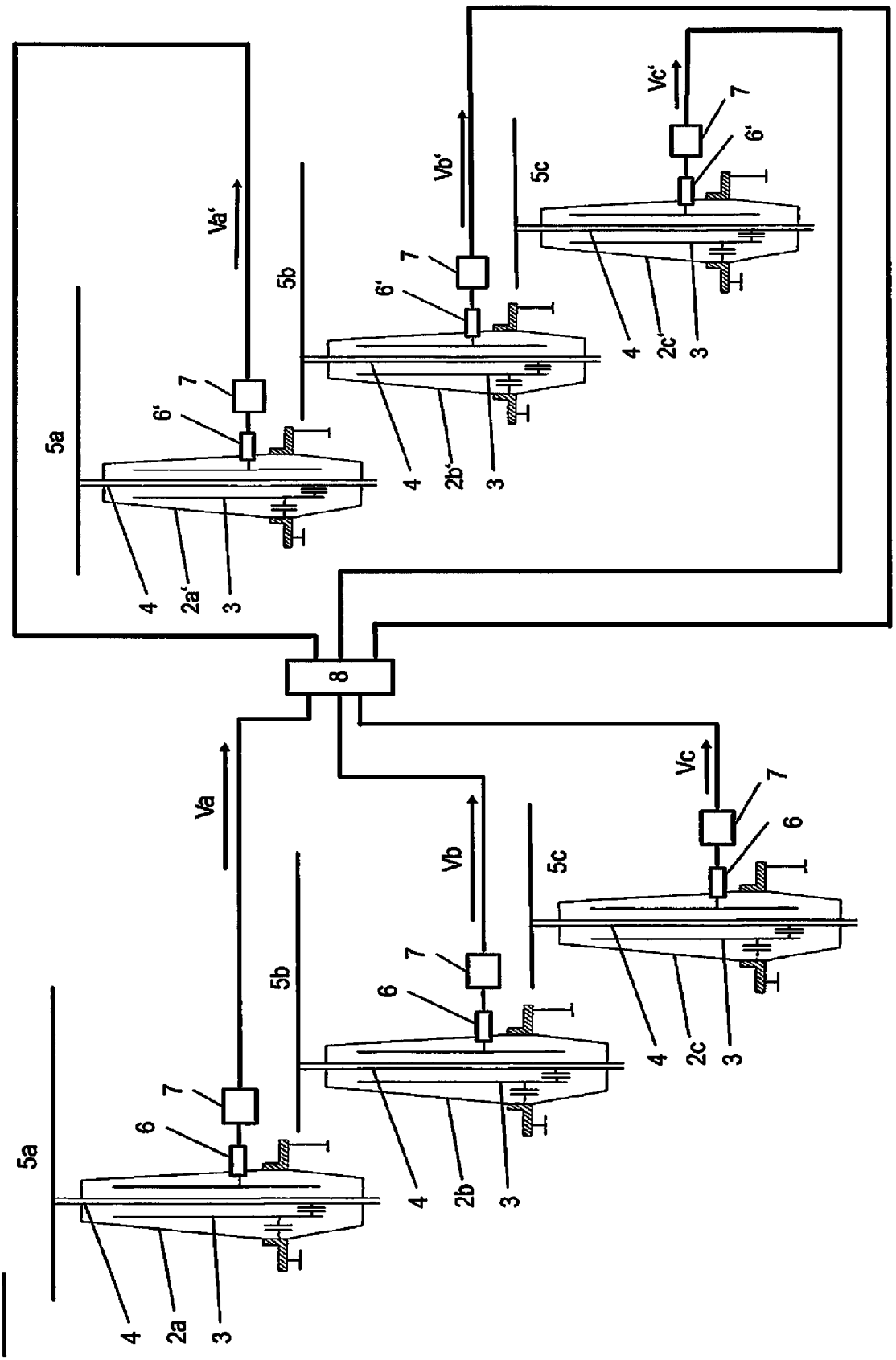

METHOD AND DEVICE FOR MONITORING CAPACITOR BUSHINGS FOR AN ALTERNATING-CURRENT GRID

CROSS-REFERENCE TO PRIOR APPLICATIONS

This application is a U.S. National Phase Application under 35 U.S.C. § 371 of International Application No. PCT/EP2018/054412, filed on Feb. 22, 2018, and claims benefit to German Patent Application No. DE 10 2017 104 109.5, filed on Feb. 28, 2017. The International Application was published in German on Sep. 7, 2018 as WO 2018/158138 under PCT Article 21(2).

FIELD

The present invention relates to a method and a device for monitoring capacitor bushings for an alternating current mains.

BACKGROUND

Electrical apparatus for alternating current mains such as, for example, power transformers and chokes are usually connected with the mains lines of the alternating current mains with the help of capacitor bushings. These capacitor bushings can be monitored through checking the capacitances and loss factors thereof in operation. In practice, the measurement values, which are measured in operation, of the capacitances and loss factors of the capacitor bushings to be monitored frequently differ from those measurement values, which have been determined in a works test shortly after production thereof. These differences then hamper evaluation of the measurement values, which were measured in operation for the monitoring, or the comparison thereof with limit values or tolerance values.

The reasons for these differences are now explained. The works test of a capacitor bushing is usually carried out at the manufacturer in a relatively small oil vessel, whereas in operation it is disposed in a much larger oil container, for example in the oil tank of a power transformer. This change of the measurement environment causes different stray capacitances and different measurement values for the same test object. The works test of a capacitor bushing is usually carried out at room temperature, whereas in operation it is exposed to a substantially higher operating temperature, which lies is at least 50° C. The temperature-dependent characteristic variable, particularly the loss factor, therefore significantly changes. The capacitor bushing in the works test is tested directly after production, whereas after installation in the electrical apparatus it can be subjected beforehand to stress factors accompanying operation. Thus, a foreign coating formed on the outer skin can, for example, critically influence the measurement value of the loss factor.

DE 195 19 230 C1 describes a monitoring method and a monitoring arrangement for a capacitor bushing for high voltages, which bushing has between its capacitor foils a tap for a sub-voltage. In this method it is provided that the sub-voltage is supplied to a detecting device which monitors the sub-voltage for change, that a change of the sub-voltage and time information with respect thereto are stored, that the interval in time between at least two changes is determined and that a fault signal corresponding with the frequency of the sub-voltage change is generated. This device includes detecting equipment in which the sub-voltage is monitored for a change, a memory in which a change of the sub-voltage and time information with respect thereto are filed, a computation element by which the interval in time between at least two changes is determined and means for generating a fault signal, wherein a fault signal proportional to the frequency of the sub-voltage change is generated. The tap is led to the detecting equipment by means of a measuring line via a measuring bushing. A tap supplies a sub-voltage corresponding with an image of the high voltage present at the inside of the capacitor bushing.

Since in this monitoring method and this monitoring arrangement, the high voltage present at the capacitor bushing acts on the measurement signals and can strongly fluctuate, the measurement values detected at the tap fluctuate substantially. Reliable monitoring of the capacitor bushing is thus not guaranteed.

DE 100 37 432 A1 describes a method and a device for monitoring a capacitor bushing which is acted on by an electrical operating voltage and in which a voltage divider is formed by an electrically conductive liner. In this method it is provided that at least one measurement value of an electrical measurement variable is detected by a measurement tap connected with the liner and by ground potential and is stored, wherein after detection of the at least one measurement value the impedance between the measuring tap and ground potential is changed and at least one signal value of a measurement signal then forming is detected by the measuring tap and ground potential and is stored, wherein the interval in time between the instant of detection of the one measurement value and the instant of detection of the one signal value is so dimensioned that possible changes in the operating voltage between the two instants are negligible, wherein a characteristic variable which is compared with a predetermined target value is determined on the basis of the measurement value and the signal value by formation of a quotient, and wherein in the case of a difference of the characteristic variable from the predetermined target value a reporting signal indicating a fault of the capacitor bushing is formed. In this device a measuring tap connected with the liner and with a measuring device for detection of an electrical measurement variable is provided, wherein the impedance present between the measuring tap and ground potential includes an impedance arrangement with which a switching device is associated. The impedance arrangement includes a fixed impedance which is connectible with the measuring tap by way of a switching device and from which the measuring tap is separable. The switching device is connected with a control device. In order to monitor the capacitor bushing, the impedance arrangement is initially disposed in a first measuring state in which the switching device is open and the fixed impedance is not connected with the measuring tap. In this first measuring state a measurement value of an electrical measurement variable is detected at a first instant and stored in a memory in the measuring device. This measurement variable is here the electrical voltage present at the measuring tap relative to ground potential. In this measuring state of the impedance arrangement the impedance is formed by the parallel circuit of the capacitance and the internal resistance of the measuring apparatus. The impedance in this measuring state is termed unchanged impedance. After detection of the measurement variable the impedance arrangement is shifted into a second measuring state. For that purpose, the control device—under the control of the switching device—is shifted into the closed state. The fixed impedance is thereby now electrically conductively connected with the measuring tap. The impedance is now formed by the parallel circuit of the capacitance, the internal resistance of the measuring device and the fixed impedance. In this second measuring state a signal value of a measurement signal which forms is now detected by the measuring device at a second instant and similarly stored. The measurement signal is the electrical voltage present at the measuring tap relative to ground potential. In this second measuring state, the impedance is termed changed impedance.

Since in this method and known device, the operating voltage present at the capacitor bushing acts on the measurement signals and can strongly fluctuate, the measurement values detected at the measuring tap fluctuate substantially. Reliable monitoring of the capacitor bushing is thus not guaranteed.

DE 36 01 934 C2 describes a permanently monitored capacitor bushing arrangement at large-size transformers in three-phase alternating current mains. This capacitor bushing arrangement includes three capacitor bushings, each of which consists of a coil former with embedded capacitor foils. This capacitor bushing arrangement includes a respective measurement terminal connected with the last, outer capacitor foil. This capacitor bushing arrangement includes an outer flange capacitance between the last, outer capacitor foil and the earthed flange of each bushing. In this capacitor bushing arrangement it is provided that the measurement terminals of the three capacitor bushings are each connected by way of a respective smoothing capacitor with a notional star point settable to ground potential, wherein a measuring device is arranged between the notional star point and ground potential. It is provided that the measuring device is connected with a trigger device which switches off the entire arrangement in the case of a change in capacitance of the capacitor foils.

U.S. Pat. No. 4,757,263 A describes determination of capacitance values for monitoring the insulation characteristics of high-voltage bushings.

WO 2015/071253 A1 describes a method and a device for monitoring capacitor bushings for a three-phase alternating current mains, wherein each capacitor bushing includes a conductor, which is connected with one of the mains lines of the alternating current mains, and an electrically conductive foil enclosing the conductor. This method includes the steps that:

for each capacitor bushing an upper capacitance and a lower capacitance are determined;

at each capacitor bushing a measurement voltage present between the respective foil and a ground potential is detected and/or measured;

for each capacitor bushing an actual capacitance depending on the respective measurement voltage and the respective lower capacitance as well as on the measurement voltage, the lower capacitance and the upper capacitance of one of the other capacitor bushings is calculated;

for each capacitor bushing the respective upper capacitance is compared with the respective actual capacitance;

a monitoring signal which depends on the results of the capacitance comparisons is generated.

In this known method and this known device the upper capacitances of the capacitor bushings and the actual capacitances thereof in operation are compared with one another. If an actual capacitance should change, it can be concluded that the corresponding capacitor bushing is damaged.

SUMMARY

An embodiment of the present invention provides a method that monitors capacitor bushings for an alternating current mains. The alternating current mains has phases, the phases including a first phase, a second phase, and a third phase. The alternating current mains including: a first mains line of a plurality of mains lines, with which the first phase and a first capacitor bushing of the capacitor bushings are associated and at which a first mains voltage of a plurality of mains voltages is present; a second mains line of the mains lines, with which the second phase and a second capacitor bushing of the capacitor bushings are associated and at which a second mains voltage of the mains voltages is present, and a third mains line of the mains lines, with which the third phase; and a third capacitor bushing of the capacitor bushings are associated and at which a third mains voltage of the mains voltages is present. Each of the capacitor bushings has: a conductor connected with the associated one of the mains lines, and an electrically conductive foil enclosing the conductor. The method includes, for each of the phases: determining, at a predetermined initial instant for a characteristic variable, which is characteristic for the respective one of the capacitor bushings, a corresponding characteristic value; determining, at a predetermined later instant after the initial instant for the characteristic variable, a corresponding normalised characteristic value in dependence on the respective characteristic value and/or on at least one of remaining characteristic values; and checking whether the normalised characteristic value has impermissibly changed.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

FIG. 6 shows a second form of embodiment of the device.

DETAILED DESCRIPTION

Figure 1:
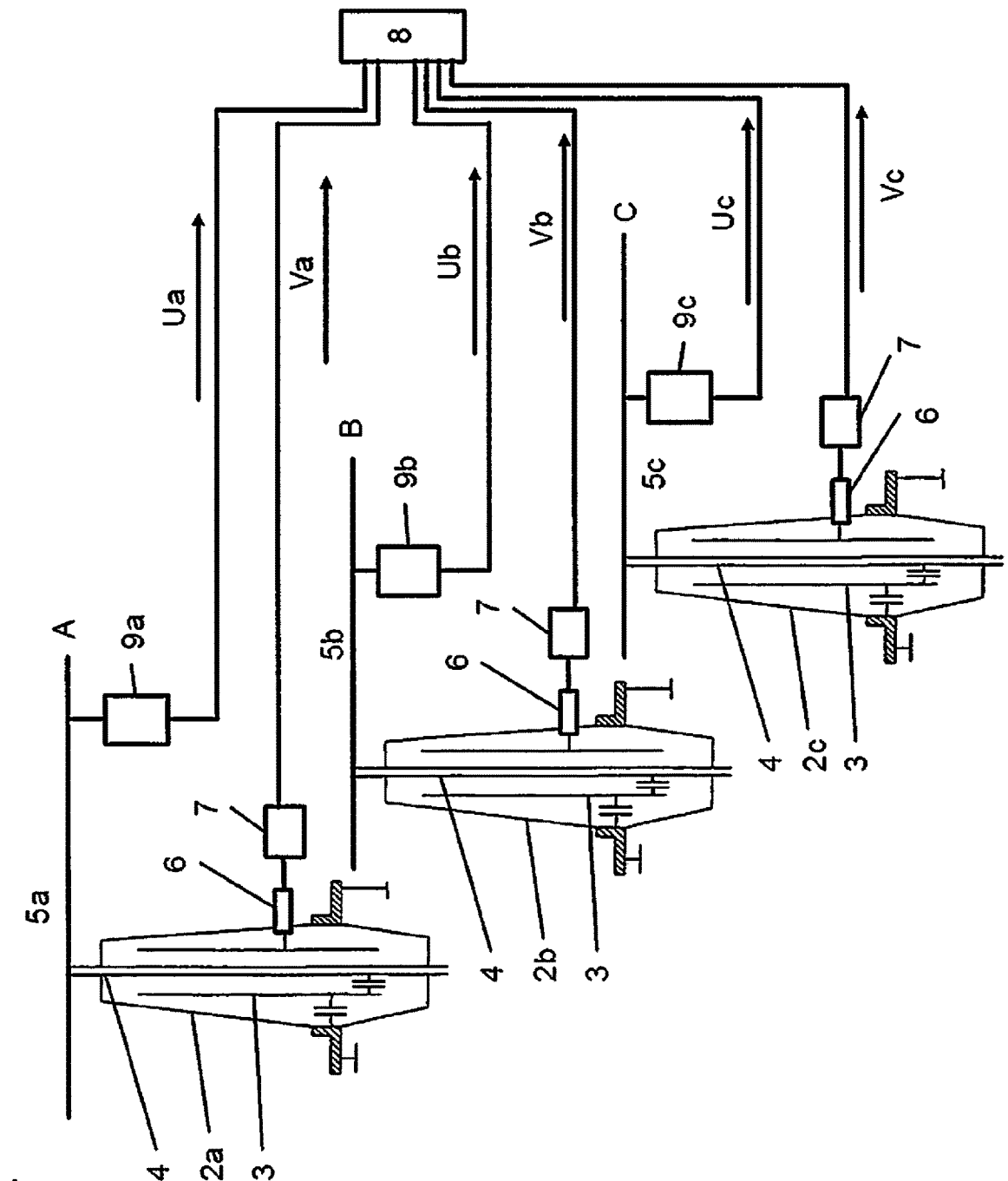
FIG. 1 shows a first form of embodiment of a device for monitoring capacitor bushings for a three-phase alternating current mains.

According to a first aspect, the present invention provides a method of monitoring capacitor bushings for an alternating current mains, wherein:

the alternating current mains has a first, second and third phase, and includes:
  a first mains line, with which the first phase and a first capacitor bushing are associated and at which a first mains voltage is present,
  a second mains line, with which the second phase and a second capacitor bushing are associated and at which a second mains voltage is present, a third mains line with which the third phase and a third capacitor bushing are associated and at which a third mains voltage is present;

each of these capacitor bushings includes:
a conductor connected with the associated mains line,
an electrically conductive foil enclosing this conductor;

for each of these phases:
at a predetermined initial instant t0 for a characteristic variable, which is characteristic for the respective capacitor bushing, a corresponding characteristic value is determined;
thereafter or after expiry of a predetermined time period or at a or the predetermined later instant to after the initial instant for the characteristic variable a corresponding normalised characteristic value is determined in dependence on the respective characteristic value and/or on at least one of the remaining characteristic values;
it is checked whether the normalised characteristic value has impermissibly changed.

In the case of a three-phase alternating current mains the term "adjacent" is defined with respect to a predetermined rotational sense of the corresponding phasor system, for example in such a way that the second phase B is adjacent to the first phase A, the third phase C is adjacent to the second phase B and the first phase A is adjacent to the third phase C.

As used herein, an expression of the kind "A is coupled to B" corresponds with an expression of the kind "A is connected with B", an expression of the kind "A is connected with B" embraces the meanings "A is directly electrically conductively connected with B" and "A is indirectly electrically conductively connected with B, thus via C", and an expression of the kind "A is attached to B" has the meaning "A is directly electrically conductively connected with B".

According to a second aspect, the present invention provides a device for monitoring capacitor bushings for an alternating current mains, wherein:

the alternating current mains has a first, second and third phase and includes:
a first mains line, with which the first phase and a first capacitor bushing are associated and at which a first mains voltage is present;
a second mains line, with which the second phase and a second capacitor bushing are associated and at which a second mains voltage is present,
a third mains line with which the third phase and a third capacitor bushing are associated and at which a third mains voltage is present;

each of these capacitor bushings includes:
a conductor connected with the associated mains line,
an electrically conductive foil enclosing this conductor;

the device includes:
an evaluating device coupled to the capacitor bushings;
the evaluating device is so constructed that for each of these phases
at a predetermined initial instant t0 for a characteristic variable, which is characteristic for the respective capacitor bushing, it can determine a corresponding characteristic value;
thereafter or after expiry of a predetermined time period or at a or the predetermined later instant to after the initial instant t0 for the characteristic variable it can determine a corresponding normalised characteristic value in dependence on the respective characteristic value and/or on at least one of the remaining characteristic values;
it can check whether the normalised characteristic value has impermissibly changed.

The present invention enables better monitoring of the capacitor bushings, because the normalised characteristic value depends—by comparison with the later characteristic value—significantly less strongly on the differences between the measuring environment in the case of works testing and the measuring environment in operation as well as on the respective measuring environment in operation.

Each capacitor bushing can be constructed in any mode and manner according to requirements and include, for example, at least one additional foil, which is arranged, in particular, between the one foil and the conductor so that this one foil represents an outermost foil.

Determination of a characteristic value can be carried out in any mode and manner according to requirements, for example at at least one of the mains lines and/or at at least one of the foils and/or by measuring, preferably at an undamaged or fault-free capacitor bushing, or by extraction from the specification sheet of the capacitor bushing or by setting to an empirical value or by taking over from an earlier cycle of the method. Alternatively or additionally, determination of at least one characteristic value can be carried out, for example, before or after or simultaneously with determination of at least one of the other characteristic values and/or before or after or simultaneously with detection of at least one voltage.

A change is impermissible when, for example, it exceeds a predetermined amount or limit value or tolerance value.

In one form of embodiment of the invention, it is specified that a monitoring signal is generated in dependence on the results of this check.

The evaluating device is preferably configured in such a way that it can execute this.

The monitoring signal can be formed in any mode and manner according to requirements, for example, as an acoustic and/or optical and/or electronic signal.

After generation of the monitoring signal, a new or next or further cycle of the method is preferably carried out.

In one form of embodiment of the invention, it is specified that
for each of these phases:
at a or the predetermined later instant to after the initial instant t0 for the characteristic variable a corresponding later characteristic value is determined;
determination of the normalised characteristic value additionally depends on the respective later characteristic value and/or on at least one of the remaining later characteristic values.

For preference the evaluating device is configured in such a way that it can execute this.

In one form of embodiment of the invention, it is specified that:
for each of these phases:
at a or the initial instant for a reference voltage a corresponding initial reference voltage value is determined;
determination of the normalised characteristic value additionally depends on the respective initial reference voltage value and/or on at least one of the remaining initial reference voltage values.

For preference the evaluating device is configured in such a way that it can execute this.

In one form of embodiment of the invention, it is specified that each reference voltage depends on the respective mains voltage.

In one form of embodiment of the invention, it is specified that:
each reference voltage is the respective mains voltage;
for each of these phases:
at the initial instant the mains voltage is detected and a corresponding initial mains voltage value is determined;
the initial mains voltage value forms the respective initial reference voltage value.

For preference the evaluating device is configured in such a way that it can execute this.

In one form of embodiment of the invention, it is specified that:
a first parallel capacitor bushing is associated with the first mains line;
a second parallel capacitor bushing is associated with the second mains line;
a third parallel capacitor bushing is associated with the third mains line;
each of these parallel capacitor bushings includes:
a conductor connected with the associated mains line,
an electrically conductive foil enclosing this conductor;
each reference voltage is a parallel foil voltage present between the foil and ground potential of the respective parallel capacitor bushing;
for each of these phases:
at the initial instant the parallel foil voltage is detected and a corresponding initial parallel foil voltage value is determined;
the initial parallel foil voltage value forms the respective initial reference voltage value.

For preference the evaluating device is configured in such a way that it can execute this.

These parallel capacitor bushings are present, for example, in order to connect, additionally to a first electrical apparatus which is connected by way of the three capacitor bushings to the three phases, a second electrical apparatus, which is here also termed parallel apparatus, to the three phases in parallel to the first apparatus. Since the parallel foil voltage values form the initial reference voltage values it is possible to dispense with detection of the mains voltages. This leads to cost savings as well as simplified maintenance and servicing, since fewer measuring instruments have to be used.

In one form of embodiment of the invention, it is specified that for each of these phases the reference voltage is a constant voltage for which a corresponding constant voltage value is predetermined. For preference the evaluating device is configured in such a way that it can execute this.

In one form of embodiment of the invention, it is specified that the constant voltage values are the same as a rated voltage value of the alternating current mains.

In one form of embodiment of the invention, it is specified that:
for each of these phases:
at a or the initial instant a foil voltage present between the respective foil and ground potential is detected and a corresponding initial foil voltage value is determined;
determination of the normalised characteristic value additionally depends on the respective initial foil voltage value and/or on at least one of the remaining initial foil voltage values.

For preference the evaluating device is configured in such a way that it can execute this.

The detection of at least one foil voltage can be carried in any mode and manner according to requirements, for example before or after or preferably simultaneously with detection of at least one of the other foil voltages and/or before or after or simultaneously with determination of at least one characteristic value.

In one form of embodiment, it is specified that:
a measuring device is coupled to these foils and for each of these phases a foil voltage present between the respective foil and ground potential can be detected;
for each of these phases
an outer capacitor is formed by the respective foil and ground potential or an electrically conductive flange, which is fastened to the outer surface of the respective capacitor bushing and which is at ground potential;
a lower-voltage capacitor is formed by a parallel circuit, which includes the measuring device and the outer capacitor;
at a or the initial instant for the lower capacitance of the lower-voltage capacitor a corresponding lower capacitance value is determined;
determination of the normalised characteristic value additionally depends on the respective lower capacitance value and/or on at least one of the remaining lower capacitance values.

For preference the evaluating device is configured in such a way that it can execute this.

The lower capacitance for each capacitor bushing can be defined in any mode and manner according to requirements, for example as the capacitance of a parallel circuit including the measuring device and the outer capacitor, which is formed by the respective outermost foil and ground potential or by the respective outermost foil and the electrically conductive flange. The lower capacitances usually lie between 1 and 5 µF, but they can also have different values according to requirements and, for example, lie between 0.1 µF and 50 µF or between 0.2 µF and 20 µF or between 0.5 µF and 10 µF. Alternatively or additionally, each of these lower capacitances and at least one of the other lower capacitances can be the same or different. For example, the lower capacitances can be in a ratio of 1:2:3 or 1:2:4 or 1:2:5 or 1:3:5 or 1:3:7 or 1:3:9 or 1:4:7 or 1:4:9 to one another.

Determination of a lower capacitance can be carried out in any mode and manner according to requirements, for example by measuring, preferably at an undamaged or fault-free capacitor bushing, or by extraction from a specification sheet of the capacitor bushing or by setting to an empirical value or by taking over from an earlier cycle of the method. Alternatively or additionally, determination of at least one lower capacitance value can be carried out, for example, before or after or simultaneously with determination of at least one of the other lower capacitance values and/or before or after or simultaneously with determination of at least one upper capacitance value and/or before or after or simultaneously with detection of at least one foil voltage.

In one form of embodiment of the invention, it is specified that:
for each of these phases:
an upper-voltage capacitor is formed by the respective foil and conductor;
the respective characteristic variable is the upper capacitance of the respective upper-voltage capacitor and the respective characteristic value is a corresponding upper capacitance value.

The upper capacitance for each capacitor bushing can be defined in any mode and manner according to requirements, for example as the capacitance of a capacitor which is formed by the respective foil and the respective conductor and which is here termed upper-voltage capacitor. The upper capacitances usually lie between 200 and 600 pF.

If the capacitor bushing has at least one additional foil then the upper capacitance can also be defined as, for example, the capacitance of a series circuit, which includes capacitors, which are here respectively formed by two adjacent foils, as well as a capacitor, which is formed by the innermost of the additional foils and the conductor, and is here similarly termed upper-voltage capacitor.

The upper capacitance values are preferably compared with the normalised upper capacitance values determined at the later instant in operation. If a normalised upper capacitance value should change, it can be concluded that the corresponding capacitor bushing is damaged.

In one form of embodiment of the invention, it is specified that:

at a or the later instant to for each of these phases the foil voltage is detected, in particular with the help of the measuring device, and a corresponding later foil voltage value is determined;

the normalised upper capacitance value of the first capacitor bushing ($2a$) is calculated in accordance with the following equation:

$$C'_a(t_n) = B_a \cdot \frac{V_a(t_n) \cdot N_a \cdot K_a}{V_b(t_n) \cdot N_b \cdot \left(\frac{B_b}{C_b} + 1\right) - V_a(t_n) \cdot N_a \cdot K_a}$$

wherein $$N_a = \frac{R_a(t_0)}{V_a(t_0)} \cdot \frac{C_a}{B_a + C_a}$$

wherein Ka is a predetermined constant or variable first correction value;

and/or the normalised upper capacitance value of the second capacitor bushing ($2b$) is calculated in accordance with the following equation:

$$C'_b(t_n) = B_b \cdot \frac{V_b(t_n) \cdot N_b \cdot K_b}{V_c(t_n) \cdot N_c \cdot \left(\frac{B_c}{C_c} + 1\right) - V_b(t_n) \cdot N_b \cdot K_a}$$

wherein $$N_b = \frac{R_b(t_0)}{V_b(t_0)} \cdot \frac{C_b}{B_b + C_b}$$

wherein Kb is a predetermined constant or variable second correction value;

and/or the normalised upper capacitance value of the third capacitor bushing ($2c$) is calculated in accordance with the following equation:

$$C'_c(t_n) = B_c \cdot \frac{V_c(t_n) \cdot N_c \cdot K_c}{V_a(t_n) \cdot N_a \cdot \left(\frac{B_a}{C_a} + 1\right) - V_c(t_n) \cdot N_c \cdot K_c}$$

wherein $$N_c = \frac{R_c(t_0)}{V_c(t_0)} \cdot \frac{C_c}{B_c + C_c}$$

wherein Kc is a predetermined constant or variable third correction value;

Ba, Bb and Bc are the first, second and third lower capacitance values;

Ca, Cb and Cc are the first, second and third upper capacitance values;

Ra(t0), Rb(t0) and Rc(t0) are the first, second and third initial reference voltage values;

Va(tn), Vb(tn) and Vc(tn) are the first, second and third later foil voltage values.

For preference the evaluating device is configured in such a way that it can execute this.

In one form of embodiment of the invention, it is specified that:

Ka=1; or

Ka=Rb(tn)/Ra(tn), wherein

Ra(tn) is a later first reference voltage value determined at a or the later instant tn for a first reference voltage associated with the first phase;

Rb(tn) is a later second reference voltage value determined at this later instant tn for a second reference voltage associated with the second phase adjacent to the first phase; and/or wherein Kb=1; or Kb=Rc(tn)/Rb(tn), wherein Rb(tn) is a later second reference voltage value determined at a or the later instant tn for a second reference voltage associated with the second phase;

Rc(tn) is a later third reference voltage value determined at this later instant tn for a third reference voltage associated with the third phase adjacent to the second phase; and/or wherein Kc=1; or Kc=Ra(tn)/Rc(tn), wherein Rc(tn) is a later third reference voltage value determined at a or the later instant tn for a third reference voltage associated with the third phase;

Ra(tn) is a later first reference voltage value determined at this later instant tn for a first reference voltage associated with the first phase adjacent to the third phase.

For preference the evaluating device is configured in such a way that it can execute this.

A correction value for which the second alternative, thus the quotient of two mains voltages, is applicable arises or makes possible an automatic correction and/or automatic compensation for asymmetries and/or differences between these two mains voltages. As a result, an even more accurate computation of the respective later normalised upper capacitance value can be achieved.

In one form of embodiment it is specified that, for the checking, the respective normalised characteristic value is compared with the respective characteristic value.

For preference the evaluating device is configured in such a way that it can execute this.

In one form of embodiment of the invention it is specified that:
tolerance values CA>0, CB>0, CC>0 for the characteristic value comparisons are determined;
if the characteristic value comparisons have the result that $$|C'_a(t_n)-C_a|C_a|\leq C_A \text{ and } |C'_b(t_n)-C_b|\leq C_B \text{ and } |C'_c(t_n)-C_c|\leq C_C$$

a monitoring signal indicating that the capacitor bushings are in proper state is then generated.

For preference the evaluating device is configured in such a way that it can execute this.

Thus, after determination of the tolerance values the characteristic value comparisons are evaluated in a checking step, which is also termed here first evaluation, and a monitoring signal dependent on the result of this first evaluation is generated.

Each of these tolerance values CA, CB, CC can be determined in any mode and manner according to requirements and, for example, set to a value corresponding with 0.001% or 0.002% or 0.003% or 0.004% or 0.005% or 0.007% or 0.01% or 0.012% or 0.015% or 0.02% of the respective characteristic value Ca, Cb, Cc or a mean value of the characteristic values Ca, Cb, Cc. This mean value can be selected as desired in accordance with requirements, for example as the arithmetic mean or the geometric mean or the harmonic mean or the square mean. Each of these tolerance values and at least one of the other tolerance values can be the same or different.

In one form of embodiment of the invention it is specified that otherwise a monitoring signal is generated which indicates that at least one of these capacitor bushings is not in proper state.

The evaluating device is preferably configured in such a way that it can execute this.

This monitoring signal is thus generated if the first evaluation has the result that the checked case is not present.

In one form of embodiment of the invention it is specified that:
tolerance values CA>0, CB>0, CC>0 for the characteristic value comparisons are determined;
if the characteristic value comparisons have the result that $$C'_a(t_n)-C_a<-C_A \text{ and } C'_b(t_n)-C_b>C_B \text{ and } |C'_c(t_n)-C_c|\leq C_C$$

a monitoring signal indicating that at least the second capacitor bushing is not in proper state is then generated;
if the characteristic value comparisons have the result that $$C'_b(t_n)-C_b<-C_B \text{ and } C'_c(t_n)-C_c>C_C \text{ and } |C'_a(t_n)-C_a|\leq C_A$$

a monitoring signal indicating that at least the third capacitor bushing is not in proper state is then generated;
if the characteristic value comparisons have the result that $$C'_c(t_n)-C_c<-C_C \text{ and } C'_a(t_n)-C_a>C_A \text{ and } |C'_b(t_n)-C_b|\leq C_B$$

a monitoring signal indicating that at least the first capacitor bushing is not in proper state is then generated.

For preference the evaluating device is configured in such a way that it can execute this.

Thus, after determination of the tolerance values the characteristic value comparisons are evaluated in four checking steps, also termed here second evaluation, and a monitoring signal dependent on the result of this second evaluation is generated. Each of these checking steps can be carried out in any mode and manner according to requirements, for example before or after or simultaneously with at least one other checking step.

Each of these tolerance values CA, CB, CC can be determined in any mode and manner according to requirements and, for example, set to a value corresponding with 0.001% or 0.002% or 0.003% or 0.004% or 0.005% or 0.007% or 0.01% or 0.012% or 0.015% or 0.02% of the respective characteristic value Ca, Cb, Cc or a mean value of the characteristic values Ca, Cb, Cc. This mean value can be selected as desired in accordance with requirements, for example as the arithmetic mean or the geometric mean or the harmonic mean or the square mean. Each of these tolerance values can be the same as or different from at least one of the other tolerance values. If tolerance values CA, CB, CC have already been determined once, for example for the first evaluation or the third evaluation described further below, then these can preferably also be taken over for this second evaluation.

In one form of embodiment of the invention it is specified that otherwise a monitoring signal indicating that at least two of these capacitor bushings are not in proper state is generated. For preference the evaluating device is configured in such a way that it can execute this.

This monitoring signal is thus generated if the second evaluation has the result that the checked cases are not present.

In one form of embodiment it is specified that
tolerance values CA>0, CB>0, CC>0 for the characteristic value comparisons are determined;
if the characteristic value comparisons have the result that $$C'_a(t_n)-C_a>C_A \text{ and } C'_b(t_n)-C_b<-C_B \text{ and } |C'_c(t_n)-C_c|\leq C_C$$

a monitoring signal indicating that the first and third capacitor bushings are not in proper state and have a fault of the same kind is then generated;
if the characteristic value comparisons have the result that $$C'_b(t_n)-C_b>C_B \text{ and } C'_c(t_n)-C_c<-C_C \text{ and } |C'_a(t_n)-C_a|\leq C_A$$

a monitoring signal indicating that the second and first capacitor bushings are not in proper state and have a fault of the same kind is then generated;
if the characteristic value comparisons have the result that $$C'_c(t_n)-C_c>C_C \text{ and } C'_a(t_n)-C_a<-C_A \text{ and } |C'_b(t_n)-C_b|\leq C_B$$

a monitoring signal indicating that the third and second capacitor bushings are not in proper state and have a fault of the same kind is then generated.

For preference the evaluating device is configured in such a way that it can execute this.

Thus, after determination of the tolerance values the characteristic value comparisons are evaluated in three checking steps, here also termed third evaluation, and a monitoring signal dependent on the result of this third evaluation is generated. Each of these checking steps can be carried out in any mode and manner according to requirements, for example before or after or simultaneously with at least one of the other checking steps.

Each of these tolerance values CA, CB, CC can be determined in any mode and manner according to requirements and, for example, set to a value corresponding with 0.001% or 0.002% or 0.003% or 0.004% or 0.005% or 0.007% or 0.01% or 0.012% or 0.015% or 0.02% of the respective characteristic value Ca, Cb, Cc or a mean value of the characteristic values Ca, Cb, Cc. This mean value can be selected as desired in accordance with requirements, for example as the arithmetic mean or the geometric mean or the harmonic mean or the square mean. Each of these tolerance values and at least one of the other tolerance values can be the same or different. If tolerance values CA, CB, CC have already been determined once, for example for the first or second evaluation, then these can preferably also be taken over for this second evaluation.

In one form of embodiment it is specified that
at an intermediate instant t1 before determination of the normalised characteristic value, particularly at a or the initial instant,
for each of these phases the reference voltage is detected and a corresponding intermediate reference value is determined;
these intermediate reference voltage values are compared with one another;
determination of the normalised characteristic values is carried out if these comparisons have the result that these intermediate reference voltage values do not differ from one another by a more than a predetermined amount.

For preference the evaluating device is configured in such a way that it can execute this.

This comparison of the mains voltages makes it possible to determine an instant at which the actual monitoring, i.e. particularly determination and checking of the normalised characteristic values and generation of the monitoring signal, is particularly advantageous or favourable, since it then cannot be hampered, hindered or even made impossible by mains voltages differing from one another by in excess of the predetermined amount. It is thus achieved that regardless of fluctuations or even failure of the mains voltages as well as the measurement tolerances during detection of the voltages a better statement about the state of the capacitor bushings can be made.

Detection of at least one mains voltage can be carried out in any mode and manner according to requirements, for example before or after or preferably simultaneously with detection of at least one of the other mains voltages and/or after or simultaneously with or preferably before determination of at least one upper capacitance and/or after or simultaneously with or preferably before determination of at least one lower capacitance and/or after or simultaneously with or preferably before detection of at least one foil voltage.

In one form of embodiment of the invention it is specified that
these voltage comparisons are carried out in such a way that
tolerance values $R_{AB}>0$, $R_{BC}>0$, $R_{CA}>0$ are determined as the respective measure;
it is checked whether $$|R_a(t_1)-R_b(t_1)| \leq R_{AB} \text{ and}$$

$$|R_b(t_1)-R_c(t_1)| \leq R_{BC} \text{ and}$$

$$|R_c(t_1)-R_a(t_1)| R_{CA};$$

$R_a(t1)$ is the intermediate reference voltage of the first phase;
$R_b(t1)$ is the intermediate reference voltage of the second phase;
$R_c(t1)$ is the intermediate reference voltage of the third phase.

For preference the evaluating device is configured in such a way that it can execute this.

Each of these tolerance values UAB, UBC, UCA can be determined in any mode and manner according to requirements and, for example, set to a value corresponding with 0.1% or 0.2% or 0.5% or 1% or 2% or 3% or 4% or 5% or 7% or 10% or 15% or 20% or 25% or 30% or 40% or 50% of the rated value of the respective mains voltage Uae, Ube, Uce. Each of these tolerance values and at least one of the other tolerance values can be the same or different.

Each of these correction values can be selected as desired according to requirements. If, for example, in each instance the first alternative, thus Ka=Kb=Kc=1, is selected for the correction values then the voltage comparison should preferably be used before the actual monitoring and in that case with further preference each of the voltage values UAB, UBC, UCA should be set to a rather low value, which corresponds with, for example 0.1% or 0.2% or 0.5% or 1% or 2% or 3% or 4% or 5% or 7% or 10% of the rated value of the respective mains voltage Uae, Ube, Uce. If, for example, in each instance the second alternative, thus Ka=Ub/Ua and Kb=Uc/Ub and Kc=Ua/Uc, is selected for the correction values then according to requirements the voltage comparison before the actual monitoring can be dispensed with or the voltage comparison can be carried out before the actual monitoring and in that case preferably each of the tolerance values UAB, UBC, UCA is set to a rather higher value, which corresponds with, for example 2% or 3% or 4% or 5% or 7% or 10% or 15% or 20% or 25% or 30% or 40% or 50% of the rated value of the respective mains voltage Uae, Ube, Uce.

In one form of embodiment of the invention it is specified that effective values and/or peak values and/or amplitudes of the reference voltages are used as these respective reference voltage values for these voltage comparisons. For preference the evaluating device is configured in such a way that it can execute this.

In one form of embodiment of the invention it is specified that
each of these characteristic variables is the loss factor of the respective capacitor bushing.

In one form one embodiment of the proposed device it is specified that the device includes
a first voltage converter, which can be connected with the first mains line;
a second voltage converter, which can be connected with the second mains line;
a third voltage converter, which can be connected with the third mains line;

an evaluating device coupled to the voltage converters
and the measuring device;
wherein
each of these voltage converters can detect the mains
voltage for the respective phase;
each reference voltage is the respective mains voltage;
the evaluating device can be constructed in such a way
that for each of these phases
at the initial instant t0 it can detect the mains voltage
with the help of the respective voltage converter and
can determine a corresponding initial mains voltage
value;
for each of these phases
the initial mains voltage value forms the respective
initial reference voltage value.

In one form of embodiment of the proposed device it is
specified that
a first parallel capacitor bushing is associated with the first
mains line;
a second parallel capacitor bushing is associated with the
second mains line;
a third parallel capacitor bushing is associated with the
third mains line;
each of these parallel capacitor bushings includes:
a conductor connected with the associated mains line,
an electrically conductive foil enclosing this conductor;
the device includes:
a first parallel measuring adapter which can be connected with the foil of the first parallel capacitor
bushing;
a second parallel measuring adapter which can be
connected with the foil of the second parallel capacitor bushing;
a third parallel measuring adapter which can be connected with the foil of the third parallel capacitor
bushing;
a measuring device coupled to the parallel measuring
adapter;
the measuring device for each of these phases can detect
a parallel foil voltage, which is present between the
respective foil and ground potential, with the help of
the respective parallel measuring adapter;
each reference voltage is the respective parallel foil
voltage;
the evaluating device is so constructed that for each of
these phases
at the initial instant it can detect the parallel foil voltage
with the help of the measuring device and can
determine a corresponding initial foil voltage value;
for each of these phase
the initial parallel foil voltage value forms the respective initial reference voltage value.

These parallel capacitor bushings are, for example, present in order to connect, additionally to a first electrical
apparatus which is connected to the three phases by way of
the three capacitor bushings, a second electrical apparatus,
which is here also termed parallel apparatus, to the three
phases in parallel to the first apparatus. Since the parallel foil
voltage values form the initial reference voltage values, it is
possible to dispense with the voltage converter for detection
of the mains voltages. This leads to costs savings as well as
simplified maintenance and servicing, since no measuring
instruments additional to the measuring adapters and parallel
measuring adapters which are required in any case have to
be used.

In one form of embodiment of the proposed device it is
specified that the device includes
a first measuring adapter which can be connected with the
foil of the first capacitor bushing;
a second measuring adapter which can be connected with
the foil of the second capacitor bushing;
a third measuring adapter which can be connected with
the foil of the third capacitor bushing;
a or the measuring device coupled to the measuring
adapter;
wherein
the evaluating device is coupled to the measuring device;
the measuring device for each of these phases can detect
a foil voltage, which is present between the respective
foil and ground potential, with the help of the respective measuring adapter;
the evaluating device is so constructed that for each of
these phases
at a or the initial instant it can detect the foil voltage
with the help of the measuring device and can
determine a corresponding initial foil voltage value;
for each of these phases
determination of the normalised characteristic value
additionally depends on the respective initial foil
voltage value and/or on at least one of the remaining
initial foil voltage values.

The proposed device can be constructed in any mode and
manner according to requirements and, for example, include
at least one further measuring device and/or at least one
further measuring adapter and/or at least one further parallel
measuring adapter and/or at least one further evaluating
device. It is possible to provide for each measuring adapter,
for example, an individual measuring device and/or an
individual evaluating device. Alternatively, the measuring
device can be constructed as a common measuring device
for at least two or for all measuring adapters and/or for at
least two or for all parallel measuring adapters.

In one form of embodiment of the proposed device it is
specified that
for each of these phases
an outer capacitor is formed by the respective outermost foil and ground potential or an electrically
conductive flange, which is fastened to the outer
surface of the respective capacitor bushing and
which is at ground potential;
a lower-voltage capacitor is formed by a parallel circuit
including the measuring device and the respective
outer capacitor;
the evaluating device is so constructed that for each of
these phases
at a or the initial instant for the lower capacitance of the
lower-voltage capacitor it can determine a corresponding lower capacitance value;
for each of these phases
determination of the normalised characteristic value
additionally depends on the respective lower capacitance value and/or on at least one of the remaining
lower capacitance values.

In one form of embodiment of the proposed device it is
specified that
the evaluating device is so constructed that at a or the later
instant to for each of these phases it
can detect the foil voltage, particularly with the help of
the measuring device, and can determine a corresponding later foil voltage value;

the evaluating device (8) is so constructed that it can calculate the normalised upper capacitance value of the first capacitor bushing (2a) in accordance with the following equation:

$$C'_a(t_n) = B_a \cdot \frac{V_a(t_n) \cdot N_a \cdot K_a}{V_b(t_n) \cdot N_b \cdot \left(\frac{B_b}{C_b} + 1\right) - V_a(t_n) \cdot N_a \cdot K_a}$$

wherein $$N_a = \frac{R_a(t_0)}{V_a(t_0)} \cdot \frac{C_a}{B_a + C_a}$$

wherein Ka is a predetermined constant or variable first correction value;
and/or
the evaluating device (8) is so constructed that it calculates the normalised upper capacitance value of the second capacitor bushing (2b) in accordance with the following equation:

$$C'_b(t_n) = B_b \cdot \frac{V_b(t_n) \cdot N_b \cdot K_b}{V_c(t_n) \cdot N_c \cdot \left(\frac{B_c}{C_c} + 1\right) - V_b(t_n) \cdot N_b \cdot K_a}$$

wherein $$N_b = \frac{R_b(t_0)}{V_b(t_0)} \cdot \frac{C_b}{B_b + C_b}$$

wherein Kb is a predetermined constant or variable second correction value;
and/or
the evaluating device (8) is so constructed that it calculates the normalised upper capacitance value of the third capacitance bushing (2c) in accordance with the following equation:

$$C'_c(t_n) = B_c \cdot \frac{V_c(t_n) \cdot N_c \cdot K_c}{V_a(t_n) \cdot N_a \cdot \left(\frac{B_a}{C_a} + 1\right) - V_c(t_n) \cdot N_c \cdot K_c}$$

wherein $$N_c = \frac{R_c(t_0)}{V_c(t_0)} \cdot \frac{C_c}{B_c + C_c}$$

wherein Kc is a predetermined constant or variable third correction value;
Ba, Bb and Bc are the first, second and third lower capacitance values;
Ca, Cb and Cc are the first, second and third upper capacitance values;
Ra(t0), Rb(t0) and Rc(t0) are the first, second and third initial reference voltage values;
Va(tn), Vb(tn) and Vc(tn) are the first, second and third later foil voltage values.

In one form of embodiment of the proposed device it is specified that each of these voltage converters is constructed as a capacitive voltage converter or inductive voltage converter or resistive voltage converter.

Each voltage converter can be constructed in any mode and manner according to requirements and/or by realised by means of various suitable principles. It can be, for example, of inductive and/or capacitive and/or resistive construction and/or include conductive and/or capacitive and/or resistive components and/or subassemblies. For preference it can include capacitive voltage divider, which includes two capacitors connected in series, and two coils or windings, which are connected as a transformer for inductive electrical isolation.

The evaluating device can be constructed in any mode and manner according to requirements, for example as a common evaluating device for at least two or for all measuring devices and/or for at least two or for all voltage converters. Alternatively or additionally it can include, for example, a superordinate evaluating device and, for each phase, an individual subordinate evaluating device, which is connected with the measuring device belonging to the respective phase, with the voltage converter belonging to the respective phase and with the superordinate evaluating device.

In one form of embodiment of the proposed device it is specified that the measuring device includes at least one measuring capacitor and/or at least one measuring coil.

In one form of embodiment of the proposed device it is specified that
the measuring device includes:
  a first measuring coil connected with the first measuring adapter;
  a second measuring coil connected with the second measuring adapter;
  a third measuring coil connected with the third measuring adapter;
  the inductances of these three measuring coils are different.

In one form of embodiment of the proposed device it is specified that the three inductances are in the ratio 1:2:3 or 1:2:4 or 1:2:5 or 1:3:5 or 1:3:7 or 1:3:9 or 1:4:7 or 1:4:9 relative to one another.

In one form of embodiment of the proposed device it is specified that
the measuring device includes:
  a first measuring capacitor connected with the first measuring adapter;
  a second measuring capacitor connected with the second measuring adapter;
  a third measuring capacitor connected with the third measuring adapter;
  the capacitances of these three measuring capacitors are different.

In one form of the proposed device it is specified that the three capacitances are in the ratio of 1:2:3 or 1:2:4 or 1:2:5 or 1:3:5 or 1:3:7 or 1:3:9 or 1:4:7 or 1:4:9 to one another.

The capacitance of at least one of the measuring capacitors is preferably larger by a multiple than the capacitance of the respective outer capacitor.

The capacitances of the measuring capacitors usually lie between 1 and 5 µF, but depending on requirements they can also have other values and, for example, lie between 0.1 µF and 50 µF or between 0.2 µF and 20 µF or between 0.5 µF and 10 µF.

The capacitances of the measuring capacitors can be selected in any mode and manner according to requirements.

Thus, for example, for the case that in each phase a measuring adapter is connected with an individual measuring capacitor associated only with it and these three measuring capacitors are combined into a common measuring device or are distributed to three individual measuring devices associated with the measuring adapters, the capacitances of these three measuring capacitors can be same or two of these capacitances can be the same and different from the third capacitance or all three capacitances can be different. This applies analogously to the measuring coils and their inductances.

One of the proposed methods can be carried out, for example, by each of the proposed devices. Each of the proposed devices can by way of example be constructed in such a way or serve such a purpose or be suitable for such a purpose that it executes or can execute one of the proposed methods.

The explanations with respect to one of the aspects of the invention, particularly to individual features of this aspect, also correspondingly apply in analogous manner to the other aspects of the invention.

Forms of embodiments of the invention are explained in more detail in the following by way of example with reference to the accompanying drawings. However, the individual features evident therefrom are not restricted to the individual forms of embodiment, but can be connected or combined with further above-described individual features or with individual features of other forms of embodiment. The details in the drawings are to be understood as merely explanatory, but not limiting. The reference numerals present in the claims are not to limit the scope of protection of the invention in any way, but refer merely to the forms of embodiment shown in the drawings.

A first form of embodiment of a device 1 for monitoring capacitor bushings 2a, 2b, 2c for an alternating current mains, which, for example, has three phases A, B, C, is schematically illustrated in FIG. 1. In this form of embodiment the capacitor bushings 2a, 2b, 2c belong to electrical apparatus (not illustrated) for an alternating current mains, which here, by way of example, is a high-voltage transformer. Capacitor bushings 2a, 2b, 2c of that kind are used with, for example, high voltages in the range of a few kV to some 1,000 kV. The alternating current mains is here, by way of example, a high-voltage mains. Each of the three capacitor bushings 2a, 2b, 2c is associated with one of the three phases A, B, C of the alternating current mains and includes a conductor 4, which is connected with the respective mains line 5a, 5b, 5c of the alternating current mains, and several electrically conductive foils, which enclose the conductor 4 in several layers or strata and of which merely the outermost foil 3 is illustrated.

The device 1 includes an evaluating device 8 as well as, for each phase A, B, C, a measuring device 7 and a measuring adapter 6, which is connected with the foil 3 of the capacitor bushing 2a, 2b, 2c belonging to the respective phase A, B, C. Each measuring adapter 6 is connected with the respective measuring device 7 so as to detect a first electrical measurement variable for the respective phase A, B, C. These first measurement variables are here electrical voltages, which are respectively present at a lower-voltage capacitor Ja, Jb, Jc, which is described further below and shown in FIG. 3, of the respective phase A, B, C and which are also termed here foil voltages Va, Vb, Vc. The evaluating device 8 is connected with each measuring device 7 so as to communicate the foil voltages Va, Vb, Vc to the evaluating device 8 and thus form a common evaluating device 8 for all measuring devices 7.

In this form of embodiment the device 1 additionally includes for each phase A, B, C a voltage converter 9a, 9b, 9c, which is connected with the respective mains line 5a, 5b, 5c so as to detect a second electrical measurement variable for the respective phase A, B, C. These second measurement variables are here electrical voltages which are respectively present at the respective mains line 5a, 5b, 5c and ground potential 13 and which here are also termed mains voltages Ua, Ub, Uc. The evaluating device 8 is connected with each voltage converter 9a, 9b, 9c so as to communicate the mains voltages Ua, Ub, Uc to the evaluating device 8 and thus form a common evaluating device 8 for all voltage converters 9a, 9b, 9c.

Through the device 1 the possibility is created that the evaluating device 8 during monitoring of the capacitor bushings 2a, 2b, 2c takes into consideration asymmetries and/or fluctuations of the mains voltages Ua, Ub, Uc on the mains lines 5a, 5b, 5c.

Figure 2:
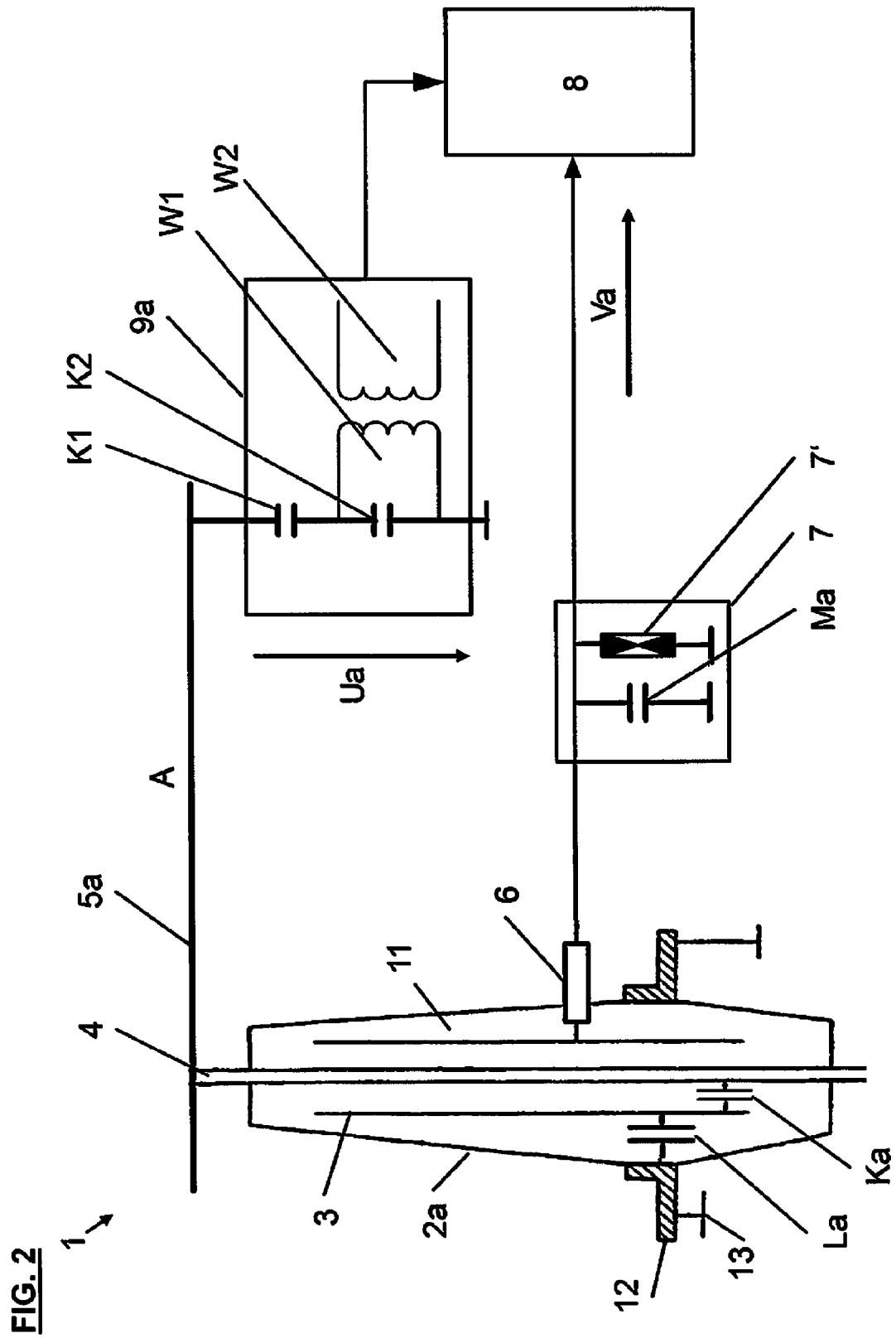
FIG. 2 shows a part of the device of FIG. 1.

A first part, which is associated with a first phase A, of the device 1 is illustrated in detail in FIG. 2. A second part (not illustrated), which is associated with a second phase B, and a third part (not illustrated), which is associated with a third phase C, of the device 1 correspond in analogous manner with this first part, so that the observations and explanations with respect to the first part correspondingly also apply to these two other parts in analogous manner.

The first capacitor bushing 2a includes an insulating body 11, through the interior of which the conductor 4 is led. This contacts, at its upper end, the associated first mains line 5a and, at its lower end, a winding (not illustrated here) of the high-voltage transformer. The electrically conductive foils, which are indicated here only by the outermost foil 3 and as seen electrically form a series circuit of capacitors, are embedded in the insulating body 11. This series circuit includes those capacitors which are respectively formed by two adjacent foils, as well as a capacitor formed by the innermost foil (not shown here) and the conductor 4. This series circuit of capacitors between the outermost foil 3 and the conductor 4 forms, in an equivalent circuit, for each capacitor bushing 2a, 2b, 2c a corresponding upper-voltage capacitor Ka, Kb, Kc with a capacitance, which is termed upper capacitance Ca, Cb, Cc.

An electrically conductive flange 12 lying at earth potential or ground potential 13 is arranged at the capacitor bushing 2a. This flange 12 serves for fastening and/or securing the capacitor bushing 2a. The outermost foil 3 forms together with the flange 12 and ground potential 13, in an equivalent circuit, for each capacitor bushing 2a, 2b, 2c a corresponding outer capacitor La, Lb, Lc with the capacitance.

The measuring adapter 6 penetrates through the insulating body 11 and produces an electrically conductive connection with the outermost foil 3. It is electrically conductively connected with the evaluating device 8 by way of the respective measuring device 7, so as to be able to detect the foil voltage Va and communicate it to the evaluating device 8. In this form of embodiment each measuring device 7 includes a measuring capacitor Ma, Mb, Mc, which is connected with ground potential 13. If required, it can include a spark gap, which is not illustrated and which is connected in parallel with the respective measuring capacitor Ma, Mb, Mc, and/or an overvoltage protector 7', which is connected in parallel with the respective measuring capacitor Ma, Mb, Mc.

The evaluating device 8 is electrically conductively connected with the mains line 5a by way of the first voltage converter 9a. Through this connection, the voltage Ua present between the mains line 5a and the ground potential 13 is detected. In this form of embodiment the voltage converter 9a is constructed as a capacitive voltage converter and includes a capacitive voltage divider, which includes two capacitors K1, K2 connected in series, and two coils or windings W1, W2, which are connected as a transformer for inductive electrical isolation.

This device 1 is suitable for executing and/or can be constructed in such a way that it can execute a method for monitoring capacitor bushings for a three-phase alternating current mains. Forms of embodiment of a method of that kind are described further below.

Figure 3:
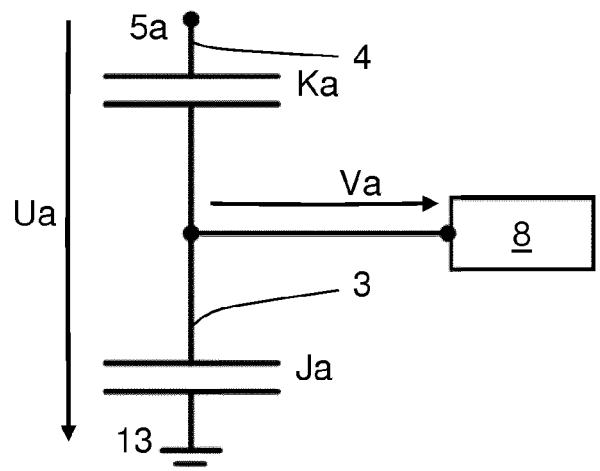
FIG. 3 shows an equivalent circuit for the first capacitor bushing of FIG. 2 with lower-voltage capacitor and upper-voltage capacitor.

An equivalent circuit consisting of the respective, first lower-voltage capacitor Ja and the respective, first upper-voltage capacitor Ka is schematically illustrated in FIG. 3 for the first phase A. A parallel circuit, which includes the respective, first measuring capacitor Ma and the respective, first outer capacitor La, forms the first lower-voltage capacitor Ja with the first lower capacitance Ba. This first lower capacitance Ba can therefore be readily calculated—by the known equation for the series circuit of capacitors—from the capacitance of the first measuring capacitor Ma and the capacitance of the first outer capacitor La. If required, the parallel circuit can include, instead of the first measuring capacitor Ma, the entire respective measuring device 7 and/or additionally the evaluating device 8, so that then the first lower capacitance Ba has to be calculated from the impedance of the measuring device 7, which depends on the capacitance of the first measuring capacitor Ma, as well as from the capacitance of the first outer capacitor La and the impedance of the evaluating device 8.

The first foil voltage Va lies, as mentioned above, at the first lower-voltage capacitor Ja and is tapped at the connecting line or the connecting point between the first lower-voltage capacitor Ja and the first upper-voltage capacitor Ka and is referred to ground potential 13. The first mains voltage Ua drops by way of the series circuit of the first upper-voltage capacitor Ka and the first lower-voltage capacitor Ja.

Figure 4:
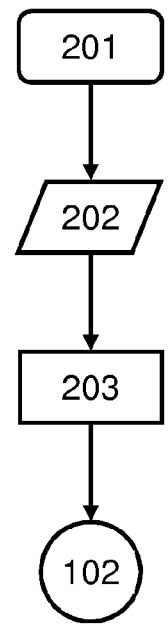
FIGS. 4 and 5 show a flow chart of one form of embodiment of a monitoring method for a three-phase alternating current mains.
Figure 5:
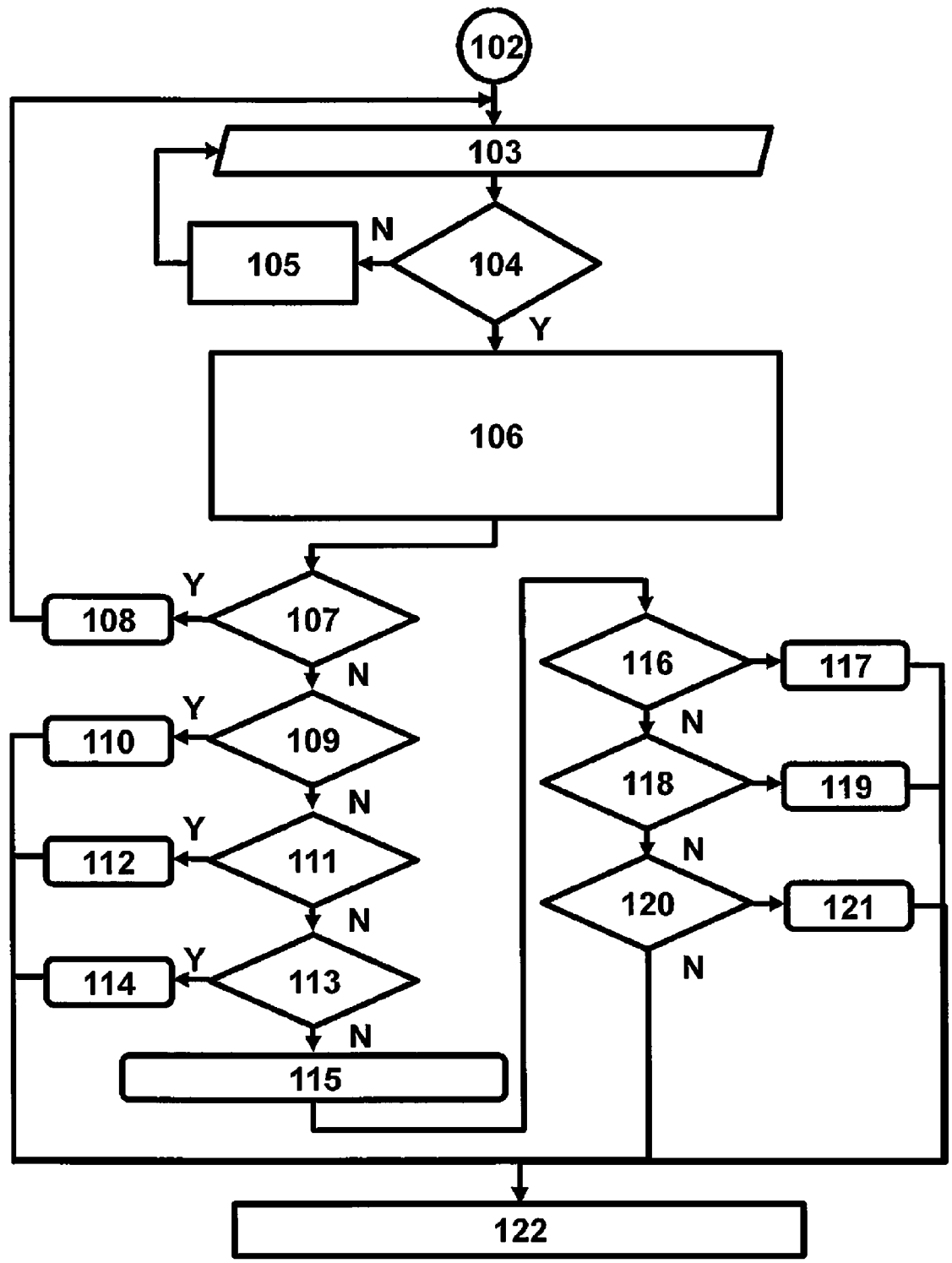

A flow chart of a first form of embodiment of a method for monitoring capacitor bushings 2a, 2b, 2c for an alternating current mains, which by way of example has three phases A, B, C, is schematically illustrated in FIG. 4 and FIG. 5. This method can be executed, by way of example, by and/or with the help of the first form of embodiment of the device 1 of FIG. 1.

In this form of embodiment the method includes the following steps, which are explained with reference to the device 1 and FIG. 1 and FIG. 2.

Step 201 (FIG. 4): Start of the method.

Step 202: This step establishes an initial instant t0. For each of these phases A, B, C a corresponding upper capacitance value Ca, Cb, Cc is determined for the upper capacitance and a corresponding initial lower capacitance value Ba, Bb, Bc is determined for the lower capacitance by the evaluating device 8. For each of these phases A, B, C the foil voltage is detected with the help of the respective measuring adapter 6 and the respective measuring device 7 and a corresponding initial foil voltage value Va(t0), Vb(t0), Vc(t0) is determined by the evaluating device 8. For each of these phases A, B, C the mains voltage is detected with the help of the respective voltage converter 9a, 9b, 9c and a corresponding initial mains voltage value Ua(t0), Ub(t0), Uc(t0) is determined by the evaluating device 8.

In this form of embodiment these capacitance values Ba, Bb, Bc, Ca, Cb, Cc are filed as fixed values in a memory of the evaluating device 8 and these upper capacitance values Ca, Cb, Cc form the initial characteristic values, these mains voltages form the reference voltages and these initial mains voltage values Ua(t0), Ub(t0), Uc(t0) form the initial reference voltage values Ra(t0), Rb(t0), Rc(t0).

Step 203: For each of these phases A, B, C a normalisation factor Na, Nb, Nc is calculated in accordance with the following equation by the evaluating device 8:

$$N_i = \frac{R_i(t_0)}{V_i(t_0)} \cdot \frac{C_i}{B_i + C_i} \text{ for which } i = a, b, c.$$

Subsequently, there is a jump to a Step 102.

Step 102 (FIG. 5): Target for the jump from Step 204.

Step 103: This step fixes an intermediate instant t1 which lies after the initial instant t0 by a predetermined time period. For each of these phases A, B, C, the mains voltage is detected with the help of the respective voltage converter 9a, 9b, 9c and a corresponding intermediate mains voltage value Ua(t1), Ub(t1), Uc(t1) is determined by the evaluating device 8.

Step 104: Tolerance values RAB>0, RBC>0, RCA>0 are determined. The effective values of the mains voltages are used as the respective intermediate mains voltage values Ua(t1), Ub(t1), Uc(t1).

In this form of embodiment these intermediate mains voltages form the intermediate reference voltages and these intermediate mains voltage values Ua(t1), Ub(t1), Uc(t1) form the intermediate reference voltage values Ra(t1), Rb(t1), Rc(t1).

It is checked in a voltage comparison whether:

$|R_a(t_1) - R_b(t_1)| \leq R_{AB}$ and $|R_b(t_1) - R_c(t_1)| \leq R_{BC}$ and $|R_c(t_1) - R_a(t_1)| \leq R_{CA}$.

If so, this means that the voltage comparison has the result that the mains voltages do not differ from one another by more than a predetermined amount. In this case, a Step 106 is executed.

If not, this means that the voltage comparison has the result that the mains voltages differ from one another by more than a predetermined amount. In this case, a Step 105 is executed.

Step 105: A warning signal indicating a short-circuit in the alternating current mains and/or a too-strong or excessive asymmetry of the mains voltages is generated. Subsequently, there is a jump Step 103.

Step 106: This step fixes a later instant to lying after the initial instant t0 by a predetermined time period and after the intermediate instant t1 by a predetermined time period. For each of these phases A, B, C the mains voltage is detected with the help of the respective voltage converter 9a, 9b, 9c and a corresponding later mains voltage value Ua(tn), Ub(tn), Uc(tn) is determined by the evaluating device 8. For each of these phases A, B, C the foil voltage is detected with the help of the respective measuring adapter 6 and the measuring device 7 and a corresponding later foil voltage value is determined by the evaluating device 8.

In this form of embodiment these later mains voltage values Ua(tn), Ub(tn), Uc(tn) form the later reference voltage values Ra(tn), Rb(tn), Rc(tn).

For each of these phases A, B, C a variable correction value Ka, Kb, Kc is calculated in accordance with the following equation by the evaluating device 8:

$$K_i = \frac{R_j(t_n)}{R_i(t_n)} \text{ for which } i = a, b, c \text{ and } j = b, c, a.$$

For each of these phases A, B, C a normalised upper capacitance value is calculated in accordance with the following equation by the evaluating device 8:

$$C'_i(t_n) = B_i \cdot \frac{V_i(t_n) \cdot N_i \cdot K_i}{V_j(t_n) \cdot N_j \cdot \left(\frac{B_j}{C_j} + 1\right) - V_i(t_n) \cdot N_i \cdot K_i} \text{ for which}$$

$$i = a, b, c \text{ and } j = b, c, a.$$

In this form of embodiment these normalised upper capacitance values Ca'(tn), Cb'(tn), Cc'(tn) form the normalised characteristic values.

Step 107: For each of these phases A, B, C the normalised characteristic value is compared with the respective characteristic value.

In this form of embodiment tolerance values CA>0, CB>0, CC>0 are determined for the characteristic value comparisons. The capacitance comparisons are carried out in such a way that initially it is checked whether $$|C'_a(t_n)-C_a| \leq C_A \text{ and } |C'_b(t_n)-C_b| \leq C_B \text{ and } |C'_c(t_n)-C_c| \leq C_C.$$

If so, a Step 108 is executed. If not, a Step 109 is executed.

Step 108: A monitoring signal is generated which indicates that the capacitor bushings 2a, 2b, 2c are in proper state. Subsequently, there is a jump to Step 103.

Step 109: The capacitance comparisons moreover are carried out in such a way that it is checked whether $$C'_a(t_n)-C_a<-C_A \text{ and } C'_b(t_n)-C_b>C_B \text{ and } |C'_c(t_n)-C_c| \leq C_C.$$

If so, a Step 110 is executed. If not, a Step 111 is executed.

Step 110: A monitoring signal indicating that at least the second capacitor bushing 2b is not in proper state is generated. Subsequently, there is a jump to a Step 122.

Step 111: The capacitance comparisons moreover are carried out in such a way that it is checked whether $$C'_b(t_n)-C_b<-C_B \text{ and } C'_c(t_n)-C_c>C_C \text{ and } |C'_a(t_n)-C_a| \leq C_A.$$

If so, a Step 112 is executed. If not, a Step 113 is executed.

Step 112: A monitoring signal indicating that at least the third capacitor bushing 2c is not in proper state is generated. Subsequently, there is a jump to Step 122.

Step 113: The capacitance comparisons moreover are carried out in such a way that it is checked whether $$C'_c(t_n)-C_c<-C_C \text{ and } C'_a(t_n)-C_a>C_A \text{ and } |C'_b(t_n)-C_b| \leq C_B.$$

If so, a Step 114 is executed. If not, a Step 115 is executed.

Step 114: A monitoring signal indicating that at least the first capacitor bushing 2a is not in proper state is generated. Subsequently, there is a jump to Step 122.

Step 115: A monitoring signal indicating that at least two capacitor bushings are not in proper state is generated.

Step 116: The capacitance comparisons moreover are carried out in such a way that it is checked whether $$C'_a(t_n)-C_a<-C_A \text{ and } C'_b(t_n)-C_b>C_B \text{ and } |C'_c(t_n)-C_c| \leq C_C.$$

If so, a Step 117 is executed. If not, a Step 118 is executed.

Step 117: A monitoring signal indicating that the first and third capacitor bushings 2a, 2c are not in proper state and have a fault of the same kind is generated. Subsequently, there is a jump to Step 122.

Step 118: The capacitance comparisons moreover are carried out in such a way that it is checked whether $$C'_b(t_n)-C_b<-C_B \text{ and } C'_c(t_n)-C_c>C_C \text{ and } |C'_a(t_n)-C_a| \leq C_A.$$

If so, a Step 119 is executed. If not, a Step 120 is executed.

Step 119: A monitoring signal indicating that the second and first capacitor bushings 2a, 2b are not in proper state and have a fault of the same kind is generated. Subsequently, there is a jump to Step 122.

Step 120: The capacitance comparisons moreover are carried out in such a way that it is checked whether $$C'_c(t_n)-C_c<-C_C \text{ and } C'_a(t_n)-C_a>C_A \text{ and } |C'_b(t_n)-C_b| \leq C_B.$$

If so, a step 121 is executed. If not, a Step 122 is executed.

Step 121: A monitoring signal indicating that the third and second capacitor bushings 2c, 2b are not in proper state and have a fault of the same kind is generated. Subsequently there is a jump to Step 122.

Step 122: A monitoring signal indicating that at least two capacitor bushings are not in proper state and do not have a fault of the same kind is generated. Subsequently, the method is concluded or, if required, there is a jump to Step 103.

A second form of embodiment of the device 1 is schematically illustrated in FIG. 6. This form of embodiment is similar to the first form of embodiment, so that primarily the differences are explained in more detail in the following.

This form of embodiment is suitable for, for example, an alternating current mains which includes additionally to the first electrical apparatus, which is connected with the three phases A, B, C by way of the three capacitor bushings 2a, 2b, 2c, a second electrical apparatus (not illustrated), which is connected with the three phases in parallel to the first apparatus and which is here also termed parallel apparatus. This parallel apparatus is connected with the three mains lines 5a, 5b, 5c analogously to the first apparatus by way of three individual capacitor bushings 2a', 2b', 2c', which here are also termed parallel capacitor bushings.

In this form of embodiment the voltage converters 9 are eliminated and the device 1 includes, instead, for each of the three phases A, B, C a parallel measuring adapter 6', which is connected with the foil 3 of the respective parallel capacitor bushing 2a', 2b', 2c', as well as a measuring device 7, which is coupled to the respective parallel measuring adapter 6' and the evaluating device 8. The evaluating device 8 thus forms a common evaluating device 8 for all six measuring devices 7.

Each of these measuring devices 7 is constructed in such a way that for the respective phase A, B, C it can detect a parallel foil voltage Va', Vb', Vc', which is present between the foil 3 of the respective parallel capacitor bushing 2a', 2b', 2c' and ground potential 13, with the help of the respective parallel measuring adapter 6'. The evaluating device 8 is constructed in such a way that for each of these phases it can detect at the initial or later instant the parallel foil voltage with the help of the respective measuring device 7 and can determine a corresponding initial or later foil voltage value which forms the respective initial or later reference voltage value.

In this form of embodiment each reference voltage is thus a respective parallel foil voltage. Since the parallel foil voltage values thus form the reference voltage values it is possible to dispense with detection of the mains voltages.

This second form of embodiment of the device 1 of FIG. 6 can, for example, execute a second form of embodiment of the method. This form of embodiment is similar to the first form of embodiment, so that primarily the differences are explained in more detail in the following.

In this form of embodiment there is detected in Step 202 for each of these phases A, B, C not the mains voltage, but the parallel foil voltage with the help of the respective parallel measuring adapter 6' and the measuring device 7, and a corresponding initial parallel foil voltage value Va'(t0), Vb'(t0), Vc'(t0) is determined by the evaluating device 8. Thus, these parallel foil voltages form the reference voltages and these initial parallel foil voltage values form the initial reference voltage values Ra(t0), Rb(t0), Rc(t0).

In this form of embodiment there is detected in Step 103 for each of these phases A, B, C not the mains voltage, but the parallel foil voltage with the help of the respective parallel measuring adapter 6' and the measuring device 7, and a corresponding parallel foil voltage value Va'(t), Vb'(t), Vc'(t) is determined by the evaluating device 8.

In this form of embodiment the mains voltage values Ua(t), Ub(t), Uc(t) are replaced in Step 104 by these parallel foil voltage values Va'(t), Vb'(t), Vc'(t).

In this form of embodiment there is detected in Step 106 for each of these phases A, B, C not the mains voltage, but the parallel foil voltage with the help of the respective parallel measuring adapter 6' and the measuring device 7, and a corresponding later parallel foil voltage value Va'(tn), Vb'(tn), Ve(tn) is determined by the evaluating device 8. These later parallel foil voltage values Va'(tn), Vb'(tn), Vc'(tn) thus form the later reference voltage values Ra(tn), Rb(tn), Rc(tn).

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The following is a list of reference numerals used herein:
1 device for monitoring capacitor bushings
2a/2b/2c first/second/third capacitor bushing to be monitored
2a'/2b'/2c' first/second/third parallel capacitor bushing
3 foil of 2, 2'
4 conductor of 2, 2'
5a/5b/5c first/second/third mains line
6 measuring adapter
6' parallel measuring adapter
7 measuring device
7' overvoltage protector
8 evaluating device
9a/9b/9c first/second/third voltage converter
11 insulating body
12 flange
13 ground potential
A/B/C first/second/third phase
Ja/Jb/Jc first/second/third lower-voltage capacitor
K1, K2 capacitors in 9
Ka/Kb/Kc first/second/third upper-voltage capacitor
La/Lb/Lc first/second/third outer capacitor
Ma/Mb/Mc first/second/third measuring capacitor
W1, W2 windings in 9
Ba/Bb/Bc lower capacitance value of Ja/Jb/Jc
Ca/Cb/Cc upper capacitance value of Ka/Kb/Kc, characteristic value for A/B/C
Ca'/Cb'/Cc' normalised upper capacitance value of Ka/Kb/Kc, normalised characteristic value for A/B/C
CA/CB/CC tolerance value for A/B/C
Ka/Kb/Kc correction value for A/B/C
Ra/Rb/Rc first/second/third reference voltage
Rae/Rbe/Rce effective value of Na/Nb/Nc
t0/t1/tn initial instant/intermediate instant/later instant
Ua/Ub/Uc first/second/third mains voltage
Uae/Ube/Uce effective value of Ua/Ub/Uc
UAB/UBC/UCA tolerance value for A/B/C
Va/Vb/Vc first/second/third foil voltage of 2
Va'/Vb'/Vc' first/second/third parallel foil voltage of 2'

The invention claimed is:

1. A method of monitoring capacitor bushings for an alternating current mains, the alternating current mains having phases, the phases comprising a first phase, a second phase, and a third phase, the alternating current mains comprising:
a first mains line of a plurality of mains lines, with which the first phase and a first capacitor bushing of the capacitor bushings are associated and at which a first mains voltage of a plurality of mains voltages is present,
a second mains line of the mains lines, with which the second phase and a second capacitor bushing of the capacitor bushings are associated and at which a second mains voltage of the mains voltages is present, and a third mains line of the mains lines, with which the third phase and a third capacitor bushing of the capacitor bushings are associated and at which a third mains voltage of the mains voltages is present;

each of the capacitor bushings comprising:

a conductor connected with the associated one of the mains lines, and an electrically conductive foil enclosing the conductor, and the method comprising, for each of the phases:

determining, at a predetermined initial instant for a characteristic variable, which is characteristic for the respective one of the capacitor bushings, a corresponding characteristic value;

determining, at a predetermined later instant after the initial instant for the characteristic variable, a corresponding normalised characteristic value in dependence on the respective characteristic value and/or on at least one of remaining characteristic values; and checking whether the normalised characteristic value has impermissibly changed.

2. The method according to claim 1, wherein for each of the phases:

at the predetermined later instant after the initial instant for the characteristic variable, a corresponding later characteristic value is determined; and determination of the normalised characteristic value additionally depends on the respective later characteristic value and/or on at least one of the remaining later characteristic values.

3. The method according to claim 1, wherein for each of the phases:

at the initial instant, for a reference voltage, a corresponding initial reference voltage value is determined; and determination of the normalised characteristic value additionally depends on the respective initial reference voltage value and/or on at least one of the remaining initial reference voltage values.

4. The method according to claim 3, wherein the reference voltage of each of the phase depends on the respective one of the mains voltages.

5. The method according to claim 4, wherein for each of the phases:

the reference voltage is the respective one of the mains voltages;

at the initial instant the respective one of the mains voltages is detected and a corresponding initial mains voltage value is determined; and the initial mains voltage value forms the respective initial reference voltage value.

6. The method according to claim 4, wherein:

a first parallel capacitor bushing of a plurality of parallel capacitor bushings is associated with the first mains line;

a second parallel capacitor bushing of the capacitor bushings is associated with the second mains line;

a third parallel capacitor bushing of the parallel capacitor bushings is associated with the third mains line;

each of the parallel capacitor bushings comprises:

a conductor connected with the associated one of the mains lines, and an electrically conductive foil enclosing this the conductor;

each reference voltage is a parallel foil voltage present between the foil and ground potential of the respective one of the parallel capacitor bushings; and for each of the phases:

at the initial instant the parallel foil voltage is detected and a corresponding initial parallel foil voltage value is determined; and the initial parallel foil voltage value forms the respective initial reference voltage value.

7. The method according to claim 1, wherein for each of the phases the reference voltage is a constant voltage for which a corresponding constant voltage value is predetermined.

8. The method according to claim 1, wherein for each of the phases:

at the initial instant a foil voltage present between the respective foil and ground potential is detected and a corresponding initial foil voltage value is determined; and determination of the normalised characteristic value additionally depends on the respective initial foil voltage value and/or on at least one of the remaining initial foil voltage values.

9. The method according to claim 1, wherein:

a measuring device is coupled to the foil of each of the capacitor bushings, and for each of the phases a foil voltage present between the respective foil and ground potential can be detected; and for each of the phases:

an outer capacitor is formed by the respective foil and a ground potential;

a lower-voltage capacitor is formed by a parallel circuit, which comprises the measuring device and the outer capacitor;

at the initial instant for the lower capacitance of the lower-voltage capacitor a corresponding lower capacitance value is determined; and determination of the normalised characteristic value additionally depends on the respective lower capacitance value and/or on at least one of the remaining lower capacitance values.

10. The method according to claim 1, wherein:

for each of the phases:

an upper-voltage capacitor is formed by the respective foil and the respective conductor;

the respective characteristic variable is the upper capacitance of the respective upper-voltage capacitor and the respective characteristic value is a corresponding upper capacitance value;

at the later instant for each of the phases the foil voltage is detected and a corresponding later foil voltage value is determined;

the normalised upper capacitance value of the first capacitor bushing is calculated in accordance with the following equation:

$$C'_a(t_n) = B_a \cdot \frac{V_a(t_n) \cdot N_a \cdot K_a}{V_b(t_n) \cdot N_b \cdot \left(\frac{B_b}{C_b} + 1\right) - V_a(t_n) \cdot N_a \cdot K_a},$$

wherein $$N_a = \frac{R_a(t_0)}{V_a(t_0)} \cdot \frac{C_a}{B_a + C_a},$$

and wherein
Ka is a predetermined constant or variable first correction value;
and/or
the normalised upper capacitance value of the second capacitor bushing is calculated in accordance with the following equation:

$$C'_b(t_n) = B_b \cdot \frac{V_b(t_n) \cdot N_b \cdot K_b}{V_c(t_n) \cdot N_c \cdot \left(\frac{B_c}{C_c} + 1\right) - V_b(t_n) \cdot N_b \cdot K_a},$$

wherein $$N_b = \frac{R_b(t_0)}{V_b(t_0)} \cdot \frac{C_b}{B_b + C_b},$$

and
wherein
Kb is a predetermined constant or variable second correction value; and/or
the normalised upper capacitance value of the third capacitor bushing is calculated in accordance with the following equation:

$$C'_c(t_n) = B_c \cdot \frac{V_c(t_n) \cdot N_c \cdot K_c}{V_a(t_n) \cdot N_a \cdot \left(\frac{B_a}{C_a} + 1\right) - V_c(t_n) \cdot N_c \cdot K_c},$$

wherein $$N_c = \frac{R_c(t_0)}{V_c(t_0)} \cdot \frac{C_c}{B_c + C_c},$$

and
wherein:
Kc is a predetermined constant or variable third correction value;
Ba, Bb and Bc are the first, second and third lower capacitance values;
Ca, Cb and Cc are the first, second and third upper capacitance values;
Ra(t0), Rb(t0) and Rc(t0) are the first, second and third initial reference voltage values; and
Va(tn), Vb(tn) and Vc(tn) are the first, second and third later foil voltage values.

11. The method according to claim 10, wherein:

$Ka=1$; or $Ka=Rb(tn)/Ra(tn)$, wherein:

Ra(tn) is a later first reference voltage value determined at the later instant for a first reference voltage associated with the first phase; and
Rb(tn) is a later second reference voltage value determined at this later instant for a second reference voltage associated with the second phase adjacent to the first phase; and/or
wherein:

$Kb=1$; or $Kb=Rc(tn)/Rb(tn)$, wherein

Rb(tn) is a later second reference voltage value determined at the later instant for a second reference voltage associated with the second phase;
Rc(tn) is a later third reference voltage value determined at this later instant for a third reference voltage associated with the third phase adjacent to the second phase; and/or
wherein $Kc=1$; or $Kc=Ra(tn)/Rc(tn)$, wherein Rc(tn) is a later third reference voltage value determined at the later instant for a third reference voltage associated with the third phase; and
Ra(tn) is a later first reference voltage value determined at this later instant for a first reference voltage associated with the first phase adjacent to the third phase.

12. The method according to claim 1, wherein for the checking, the respective normalised characteristic value is compared with the respective characteristic value.

13. The method according to claim 12, wherein
tolerance values CA>0, CB>0, CC>0 for the characteristic value comparisons are determined;
if the characteristic value comparisons have the result that:

$|C'_a(t_n)-C_a| \leq C_A$ and $|C'_b(t_n)-C_b| \leq C_B$ and $|C'_c(t_n)-C_c| \leq C_C$, a monitoring signal indicating that the capacitor bushings are in proper state is generated.

14. The method according to claim 1, wherein:
tolerance values CA>0, CB>0, CC>0 for the characteristic value comparisons are determined;
if the characteristic value comparisons have the result that:

$C'_a(t_n)-C_a < -C_A$ and $C'_b(t_n)-C_b > C_B$ and $|C'_c(t_n)-C_c| \leq C_C$, a monitoring signal indicating that at least the second capacitor bushing is not in proper state is generated;
if the characteristic value comparisons have the result that:

$C'_b(t_n)-C_b < -C_B$ and $C'_b(t_n)-C_b > C_C$ and $|C'_a(t_n)-C_a| \leq C_A$, a monitoring signal indicating that at least the third capacitor bushing is not in proper state is generated;
if the characteristic value comparisons have the result that:

$C'_c(t_n)-C_c < -C_C$ and $C'_a(t_n)-C_a > C_A$ and $|C'_b(t_n)-C_b| \leq C_B$, a monitoring signal indicating that at least the first capacitor bushing is not in proper state is generated; and
otherwise a monitoring signal indicating that at least two of these capacitor bushings are not in proper state is generated.

15. The method according to claim 1, wherein:
tolerance values CA>0, CB>0, CC>0 for the characteristic value comparisons are determined;
if the characteristic value comparisons have the result that:

$$C'_a(t_n)-C_a>C_A \text{ and } C'_b(t_n)-C_b<-C_B \text{ and } |C'_c(t_n)-C_c|\leq C_C,$$

a monitoring signal indicating that the first and third capacitor bushings are not in proper state and have a fault of the same kind is generated;
if the characteristic value comparisons have the result that $$C'_b(t_n)-C_b>C_B \text{ and } C'_c(t_n)-C_c<-C_C \text{ and } |C'_a(t_n)-C_a|\leq C_A,$$

a monitoring signal indicating that the second and first capacitor bushings are not in proper state and have a fault of the same kind is generated; and
if the characteristic value comparisons have the result that:

$$C'_c(t_n)-C_c>C_C \text{ and } C'_a(t_n)-C_a<-C_A \text{ and } |C'_b(t_n)-C_b|\leq C_B,$$

a monitoring signal indicating that the third and second capacitor bushings are not in proper state and have a fault of the same kind is generated.

16. The method according to claim 1, wherein at an intermediate instant before determination of the normalised characteristic value:
for each of the phases, the reference voltage is detected and a corresponding intermediate reference value is determined;
the intermediate reference voltage values are compared with one another; and
determination of the normalised characteristic values is carried out if the comparisons have the result that the intermediate reference voltage values do not differ from one another by a more than a predetermined amount.

17. The method according claim 16, wherein the voltage comparisons are carried out in such a way that:
tolerance values RAB>0, RBC>0, RCA>0 are determined as the respective measure; and
it is checked whether:

$$|R_a(t_1)-R_b(t_1)|\leq R_{AB} \text{ and}$$

$$|R_b(t_1)-R_c(t_1)|\leq R_{BC} \text{ and}$$

$$|R_c(t_1)-R_a(t_1)|\leq R_{CA}, \text{ wherein:}$$

Ra(t1) is the intermediate reference voltage of the first phase;
Rb(t1) is the intermediate reference voltage of the second phase;
Rc(t1) is the intermediate reference voltage of the third phase.

18. The method according to claim 1, wherein each of the characteristic variables is the loss factor of the respective one of the capacitor bushings.

19. A device for monitoring capacitor bushings for an alternating current mains,
the alternating current mains having a plurality of phases comprising a first phase, a second phase, and a third phase, the alternating current mains comprising:
a first mains line of a plurality of mains lines, with which the first phase and a first capacitor bushing of the capacitor bushings are associated and at which a first mains voltage of a plurality of mains voltages is present,
a second mains line of the mains lines, with which the second phase and a second capacitor bushing of the capacitor bushings are associated and at which a second mains voltage of the mains voltages is present, and
a third mains line of the mains lines, with which the third phase and a third capacitor bushing of the capacitor bushings are associated and at which a third mains voltage of the mains voltages is present; and
each of the capacitor bushings comprising:
a conductor connected with the associated one of the mains lines, and
an electrically conductive foil enclosing the conductor;
the device comprising:
an evaluating device coupled to the capacitor bushings;
wherein the evaluating device is so constructed that for each of the phases:
at a predetermined initial instant for a characteristic variable, which is characteristic for the respective one of the capacitor bushings, the evaluating devices can determine a corresponding characteristic value;
at a predetermined later instant after the initial instant for the characteristic variable the evaluating device can determine a corresponding normalised characteristic value in dependence on the respective characteristic value and/or on at least one of the remaining characteristic values; and
the evaluating device can check whether the normalised characteristic value has impermissibly changed.

20. The device according to claim 19, wherein the evaluating device is so constructed that for each of these phases, the evaluating device:
can determine at a or the predetermined later instant after the initial instant for the characteristic variable a corresponding later characteristic value; and
determination of the normalised characteristic value additionally depends on the respective later characteristic value and/or on at least one of the remaining later characteristic values.

21. The device according to claim 19, wherein:
the evaluating device is so constructed that for each of the phases, the evaluating device can determine at the initial instant for a reference voltage a corresponding initial reference voltage value; and
for each of the phases, determination of the normalised characteristic value additionally depends on the respective initial reference voltage value and/or on at least one of the remaining initial reference voltage values.

22. The device according to claim 20, the device comprising:
a first voltage converter of a plurality of voltage converters, which is configured to be connected with the first mains line;
a second voltage converter of the voltage converters, which is configured to be connected with the second mains line;
a third voltage converter of the voltage converters, which is configured to be connected with the third mains line;
the evaluating device coupled to the voltage converters and the measuring device; wherein:
each of the voltage converters is configured to detect the mains voltage for the respective one of the phases;
the reference voltage of each of the phases is the respective one of the mains voltages;

the evaluating device is configured to be constructed in such a way that for each of the phases at the initial instant it is configured to detect the mains voltage with the help of the respective one of the voltage converters and is configured to determine a corresponding initial mains voltage value; and for each of the phases the initial mains voltage value forms the respective initial reference voltage value.

23. The device according to claim 20, wherein:

a first parallel capacitor bushing of a plurality of parallel capacitor bushings is associated with the first mains line;

a second parallel capacitor bushing of the parallel capacitor bushings is associated with the second mains line;

a third parallel capacitor bushing of the parallel capacitor bushings is associated with the third mains line;

each of the parallel capacitor bushings comprises:
  a conductor connected with the associated one of the mains lines,
  an electrically conductive foil enclosing the conductor;

the device comprises:
  a first parallel measuring adapter which can be connected with the foil of the first parallel capacitor bushing;
  a second parallel measuring adapter which can be connected with the foil of the second parallel capacitor bushing;
  a third parallel measuring adapter which can be connected with the foil of the third parallel capacitor bushing;
  a measuring device coupled to the parallel measuring adapter;

the measuring device for each of these phases can detect a parallel foil voltage, which is present between the respective foil and ground potential, with the help of the respective parallel measuring adapter;

each reference voltage is the respective parallel foil voltage;

the evaluating device is so constructed that for each of these phases at the initial instant it can detect the parallel foil voltage with the help of the measuring device and can determine a corresponding initial foil voltage value;

for each of these phase the initial parallel foil voltage value forms the respective initial reference voltage value.

24. The device according to claim 19, comprising:

a first measuring adapter which can be connected with the foil of the first capacitor bushing;

a second measuring adapter which can be connected with the foil of the second capacitor bushing;

a third measuring adapter which can be connected with the foil of the third capacitor bushing;

a or the measuring device, which is coupled to the measuring adapter; wherein the evaluating device is coupled to the measuring device;

the measuring device for each of these phases can detect a foil voltage, which is present between the respective foil and ground potential, with the help of the respective measuring adapter;

the evaluating device is so constructed that for each of these phases at the initial instant it can detect the foil voltage with the help of the measuring device and can determine a corresponding initial foil voltage value;

for each of these phases determination of the normalised characteristic value additionally depends on the respective initial foil voltage value and/or on at least one of the remaining initial foil voltage values.

25. The device according to claim 19, wherein for each of the phases:
  an outer capacitor is formed by the respective foil and a ground potential;
  a lower-voltage capacitor is formed by a parallel circuit comprising the measuring device and the respective outer capacitor;

the evaluating device is so constructed that for each of these phases at the initial instant for the lower capacitance of the lower-voltage capacitor it can determine a corresponding lower capacitance value;

for each of these phases determination of the normalised characteristic value additionally depends on the respective lower capacitance value and/or on at least one of the remaining lower capacitance values.

26. The device according to claim 19, wherein for each of the phases:
  an upper-voltage capacitor is formed by the respective foil and conductor;
  the respective characteristic variable is the upper capacitance of the respective upper-voltage capacitor and the respective characteristic value is a corresponding upper capacitance value;

the evaluating device is so constructed that at the later instant for each of these phases it can detect the foil voltage and can determine a corresponding later foil voltage value;

the evaluating device is so constructed that it can calculate the normalised upper capacitance value of the first capacitor bushing in accordance with the following equation:

$$C'_a(t_n) = B_a \cdot \frac{V_a(t_n) \cdot N_a \cdot K_a}{V_b(t_n) \cdot N_b \cdot \left(\frac{B_b}{C_b} + 1\right) - V_a(t_n) \cdot N_a \cdot K_a},$$

wherein $$N_a = \frac{R_a(t_0)}{V_a(t_0)} \cdot \frac{C_a}{B_a + C_a},$$

and wherein $K_a$ is a predetermined constant or variable first correction value; and/or the evaluating device is so constructed that it calculates the normalised upper capacitance value of the second capacitor bushing in accordance with the following equation:

$$C'_b(t_n) = B_b \cdot \frac{V_b(t_n) \cdot N_b \cdot K_b}{V_c(t_n) \cdot N_c \cdot \left(\frac{B_c}{C_c} + 1\right) - V_b(t_n) \cdot N_b \cdot K_a},$$

wherein $$N_b = \frac{R_b(t_0)}{V_b(t_0)} \cdot \frac{C_b}{B_b + C_b},$$

and
wherein
Kb is a predetermined constant or variable second correction value; and/or the evaluating device is so constructed that it calculates the normalised upper capacitance value of the third capacitance bushing in accordance with the following equation:

$$C'_c(t_n) = B_c \cdot \frac{V_c(t_n) \cdot N_c \cdot K_c}{V_a(t_n) \cdot N_a \cdot \left(\frac{B_a}{C_a} + 1\right) - V_c(t_n) \cdot N_c \cdot K_c},$$

wherein $$N_c = \frac{R_c(t_0)}{V_c(t_0)} \cdot \frac{C_c}{B_c + C_c},$$

and
wherein:
Kc is a predetermined constant or variable third correction value;
Ba, Bb and Bc are the first, second and third lower capacitance values;
Ca, Cb and Cc are the first, second and third upper capacitance values;
Ra(t0), Rb(t0) and Rc(t0) are the first, second and third initial reference voltage values; and
Va(tn), Vb(tn) and Vc(tn) are the first, second and third later foil voltage values.

27. The device according to claim 19, wherein
the measuring device comprises:
a first measuring capacitor connected with the first measuring adapter;
a second measuring capacitor connected with the second measuring adapter;
a third measuring capacitor connected with the third measuring adapter;
the capacitances of these three measuring capacitors are different;
the three capacitances are in the ratio of 1:2:3 or 1:2:4 or 1:2:5 or 1:3:5 or 1:3:7 or 1:3:9 or 1:4:7 or 1:4:9 to one another.

\* \* \* \* \*